United States Patent
Chen

(10) Patent No.: US 9,332,669 B1
(45) Date of Patent: May 3, 2016

(54) CABLE MANAGEMENT ARM OF SERVER RACK

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 0 days.

(21) Appl. No.: 14/621,968

(22) Filed: Feb. 13, 2015

(51) Int. Cl.
*F16L 3/08* (2006.01)
*H05K 7/14* (2006.01)
*F16L 3/015* (2006.01)

(52) U.S. Cl.
CPC .............. *H05K 7/1491* (2013.01); *F16L 3/015* (2013.01)

(58) Field of Classification Search
CPC .... H05K 7/1491; H05K 7/1489; F16L 3/015; A47B 88/00; H01R 13/518
See application file for complete search history.

(56) References Cited

U.S. PATENT DOCUMENTS

| | | | | |
|---|---|---|---|---|
| 6,523,918 B1* | 2/2003 | Baiza | ................... | H05K 7/1491 211/26 |
| 6,614,978 B1* | 9/2003 | Caveney | ............... | G02B 6/4452 385/135 |
| 6,902,069 B2* | 6/2005 | Hartman | ............... | H05K 7/1491 211/26 |
| 7,355,120 B2* | 4/2008 | Herring | ................ | H05K 7/1491 174/481 |
| 7,357,667 B2* | 4/2008 | Clark | ..................... | H04Q 1/131 439/540.1 |
| 8,137,130 B2* | 3/2012 | Wang | .................. | H01R 13/518 439/540.1 |
| 8,607,993 B2* | 12/2013 | Williams | ............... | A47B 88/00 211/26 |
| 2004/0056155 A1* | 3/2004 | Chen | .................... | H05K 7/1491 248/49 |

* cited by examiner

*Primary Examiner* — Amy Sterling
(74) *Attorney, Agent, or Firm* — Rosenberg, Klein & Lee

(57) ABSTRACT

A cable management arm of a server rack includes two cable frames, two first connecting bases and two first connecting members. The cable frames are pivotally connected with each other as a whole, and the first connecting bases are installed between a rear end of a slide and the server rack, and the first connecting members are installed at open ends of the cable frames respectively. A first snap portion designed on a first elastic plate of the first connecting member is snapped into the first connecting base by the elasticity of the first elastic plate and provided for accommodating at least one connecting wire. The cable management arm may change its length as the slide is stretched or pushed, and the structural design of the first connecting base and the first connecting member is simplified significantly to lower manufacturing costs and facilitate installation and removal.

8 Claims, 9 Drawing Sheets

CABLE MANAGEMENT ARM OF SERVER RACK

BACKGROUND OF THE INVENTION

1. Field of the Invention

The present invention relates to the field of server rack equipments, and more particularly to a cable management arm installed between a slide and a server rack and having a simple structure to lower manufacturing costs and provide easy installation or removal.

2. Description of the Related Art

In general, a conventional industrial large server rack includes a plurality of accommodating spaces equidistantly formed therein for receiving a plurality of server computers, and different connecting wires installed between the server rack and the server computers for transmitting signals and power. This design allows users to draw out the server computer easily for repair, maintenance or replacement. To arrange the connecting wires, an appropriate cable management arm is installed between the server rack and each server computer for storing the connecting wires therein to prevent the situation of spaghetti cable or the difficulty of maintenance due to the disorderly arranged connecting cables.

The structural design of a general cable management arm comprises a first cable frame and a second cable frame pivotally coupled as a whole by a pivot, and the movable ends of the first cable frame and the second cable frame are connected to one of the server computer and the server rack by screw positioning elements respectively, so that when the server computers are drawn out, the cable management arm is changed from a bent and stored status into an extended status to ensure that the connecting wires remain in the cable management arm during the moving process, so that the situation of spaghetti cables will not occur.

However, the design of such cable management arm requires users to loosen the positioning elements before removing the cable management arm for the installation of an additional connecting wire or the maintenance and repair of the connecting wires, and then re-installing the positioning elements. Obviously, the process takes much time and results in a relatively low locking effect, and the positioning elements may be loosened or fallen apart easily.

In view of the problems of the prior art, the inventor of the present invention provides a structure having a cable management arm of a server rack, and the cable management arm is installed at a rear end of a slide, and cable frames are unfolded and displaced as the slide is pulled and extended, and the cable frames may be stacked and accommodated in the space for their storage, so that the server computer may slide with respect to the slide, and the cable management arm is provided for accommodating the connecting wires and restricting the movement of the connecting wires. The structural design of the present invention simplifies the components significantly to achieve the effects of lowering the manufacturing cost as well as providing a secured installation to prevent components from being loosened or fallen off.

SUMMARY OF THE INVENTION

Therefore, it is a primary objective of the present invention to provide a cable management arm of a server rack to significantly simplify the design of the elastic plate used by the first connecting member and facilitate users to embed or fix the connecting member, so that the present invention not just lowers the manufacturing cost only, but also provides a secured installation to prevent components from being loosened or fallen off. The invention further comprises a support frame for supporting the weight of the cable frame after the length of the cable frame is extended, and enhances the stability during use.

To achieve the aforementioned objective, the present invention provides a cable management arm of a server rack, and the cable management arm is installed between a rear end of a slide and the server rack for accommodating at least one connecting wire used by a server, and the cable management arm may changes its length as the slide is pulled and stretched, and the cable management arm comprises: at least two cable frames, each being a structure with a trough-shaped cross-section for accommodating the connecting wire therein, and the two cable frames being pivotally coupled as a whole by a head-to-tail connection method; a pair of first connecting bases, installed to a movable end of the slide and the server rack, and each first connecting base having a first notch and a first snap hole formed at the center of the first connecting base, so that the first snap hole is disposed at the center of the first notch; and a pair of first connecting members, installed in the first connecting base respectively, and each first connecting member comprising: a first movable plate, with a side pivotally coupled to an open end of one of the cable frames, and having a first through hole formed at the center of the first movable plate; and a first elastic plate, with an end fixed to a side of the first through hole, and having at least one first snap portion corresponsive to the first through hole, and the first snap portion having a length greater than the total thickness of the first elastic plate and the first connecting base, such that when the first connecting member is installed into the first notch, the first snap portion is passed and snapped into the first snap hole, and the cable frame is coupled between a rear end of the slide and the server rack, and the cable frame is unfolded and displaced with the stretched slide.

In an embodiment, the first snap portion of the present invention is formed by a punching method, and the first elastic plate has a section bent downwardly from a sidewall and a bevel is formed in a direction corresponsive to the direction of inserting the first connecting base, so that the first snap portion can be slidably inserted into the first snap hole for a secured connection. When it is necessary to remove the first snap portion, users simply press the first snap portion down from the opposite side of the first snap hole, so that the first elastic plate is separated in an opposite direction from the first snap hole to complete the removal of the first snap portion quickly.

In addition, the cable frame has an open top surface and includes at least one installing hole and at least one latching hole symmetrically formed at the top of the two sidewalls respectively and provided for installing a latch element therebetween, such that the connecting wire is covered therein, and an installing portion is disposed at an end of the latch element and configured to be corresponsive to the installing hole, and a hook is installed at the other end of the latch element and configured corresponsive to the latching hole, so as to improve the convenience of installation and usage.

In addition, the cable management arm of a server rack of the present invention further comprises a connecting plate with both sides pivotally coupled between the two cable frames, so that when the two cable frames are stacked and folded, the two cable frames will not interfere with each other and the storage volume can be reduced effectively.

In addition, the cable management arm of a server rack of the present invention further comprises a support frame and a pair of second connecting bases, and the second connecting bases are disposed on the two slides respectively, and each second connecting base having a second notch and a second snap hole formed at the center of the second connecting base, such that the second snap hole is disposed at the center of the second notch, such that the assembled support frame is disposed the middle across the two slides and below the cable frame and movable synchronously with the slide, for providing a support required by the cable frame.

To facilitate the installation, the cable management arm of a server rack of the present invention further comprises a pair of second movable plates and a pair of second elastic plates, and the two second movable plates being respectively and pivotally coupled to both ends of the support frame, and the second movable plate having a second through hole formed at the center of the second movable plate, and an end of the two first elastic plates being fixed to a side of the second through hole, and the two second elastic plates having at least one second snap portion configured to be corresponsive to the second through hole, and the second snap portion having a length greater than the total thickness of the second elastic plate and the second connecting base, such that when each second connecting member installed into each second notch, the second snap portion is passed and latched into the second snap hole to connect the support frame between the two slides and move synchronously as the two slides are stretched.

In addition, the second snap portion is also formed by a punching method, and two sidewalls of the second elastic plate have a section bent downwardly and a bevel is formed in a direction corresponsive to the direction of inserting the second connecting base.

DETAILED DESCRIPTION OF THE PREFERRED EMBODIMENTS

Figure 1:
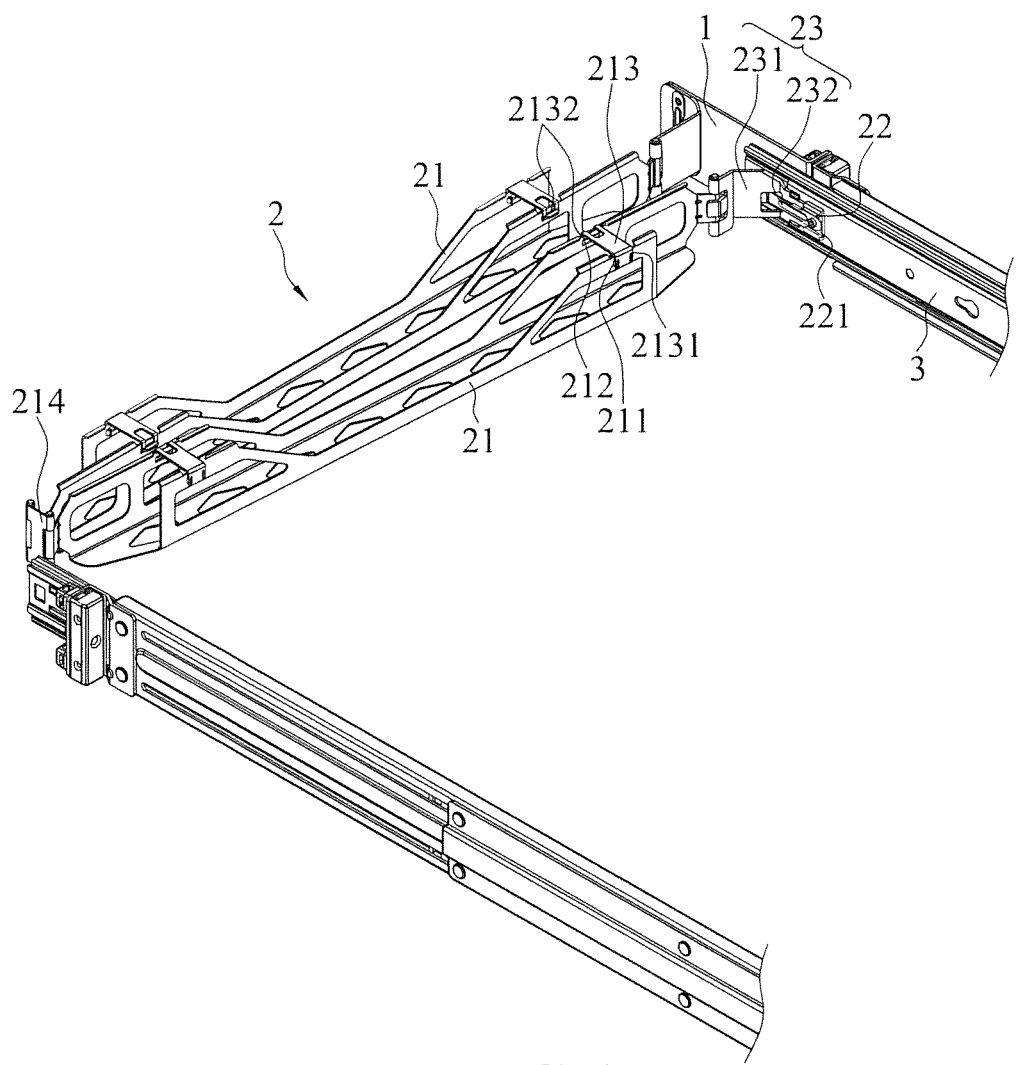
FIG. 1 is a schematic view of a preferred embodiment of the present invention.
Figure 2:
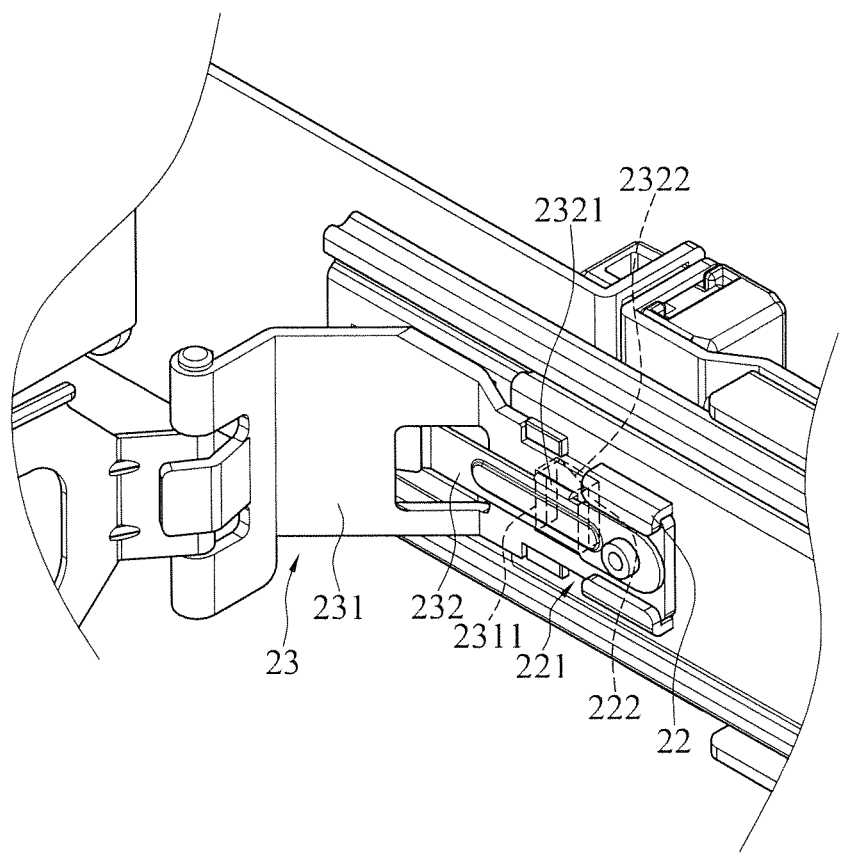
FIG. 2 is a first partial blowup view of a preferred embodiment of the present invention.
Figure 3:
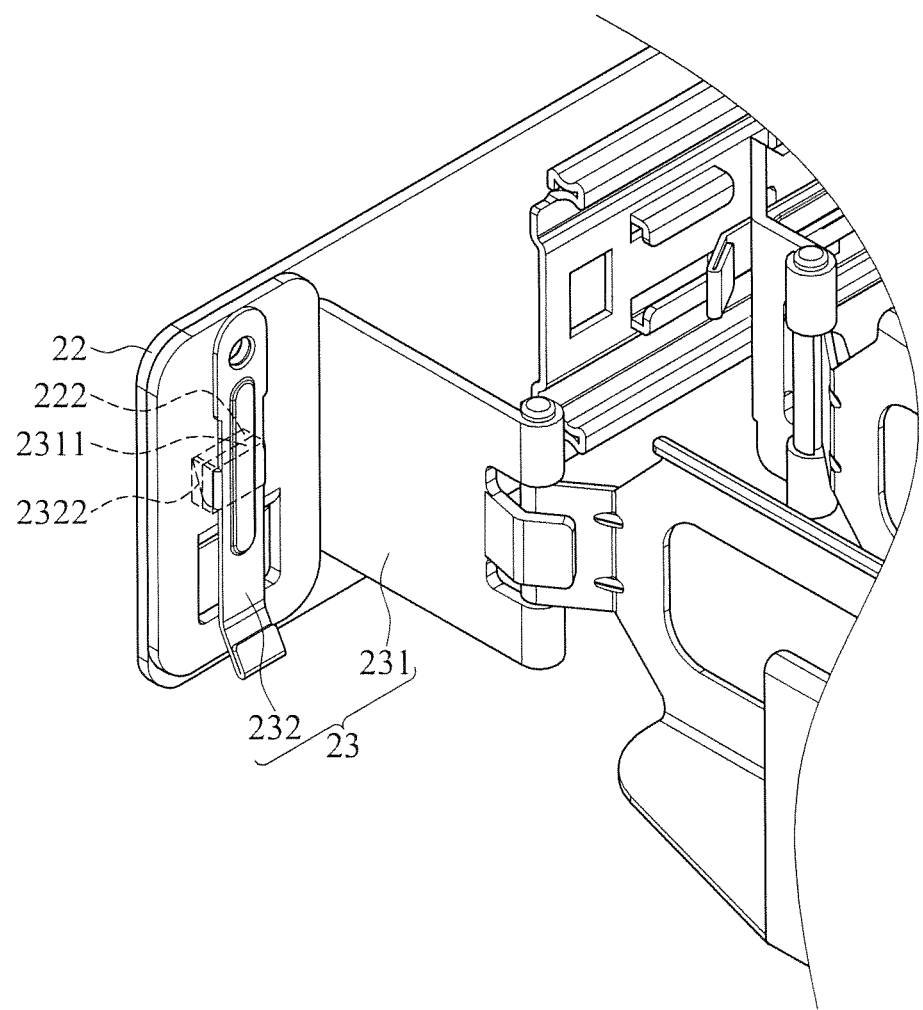
FIG. 3 is a second partial blowup view of a preferred embodiment of the present invention.
Figure 4:
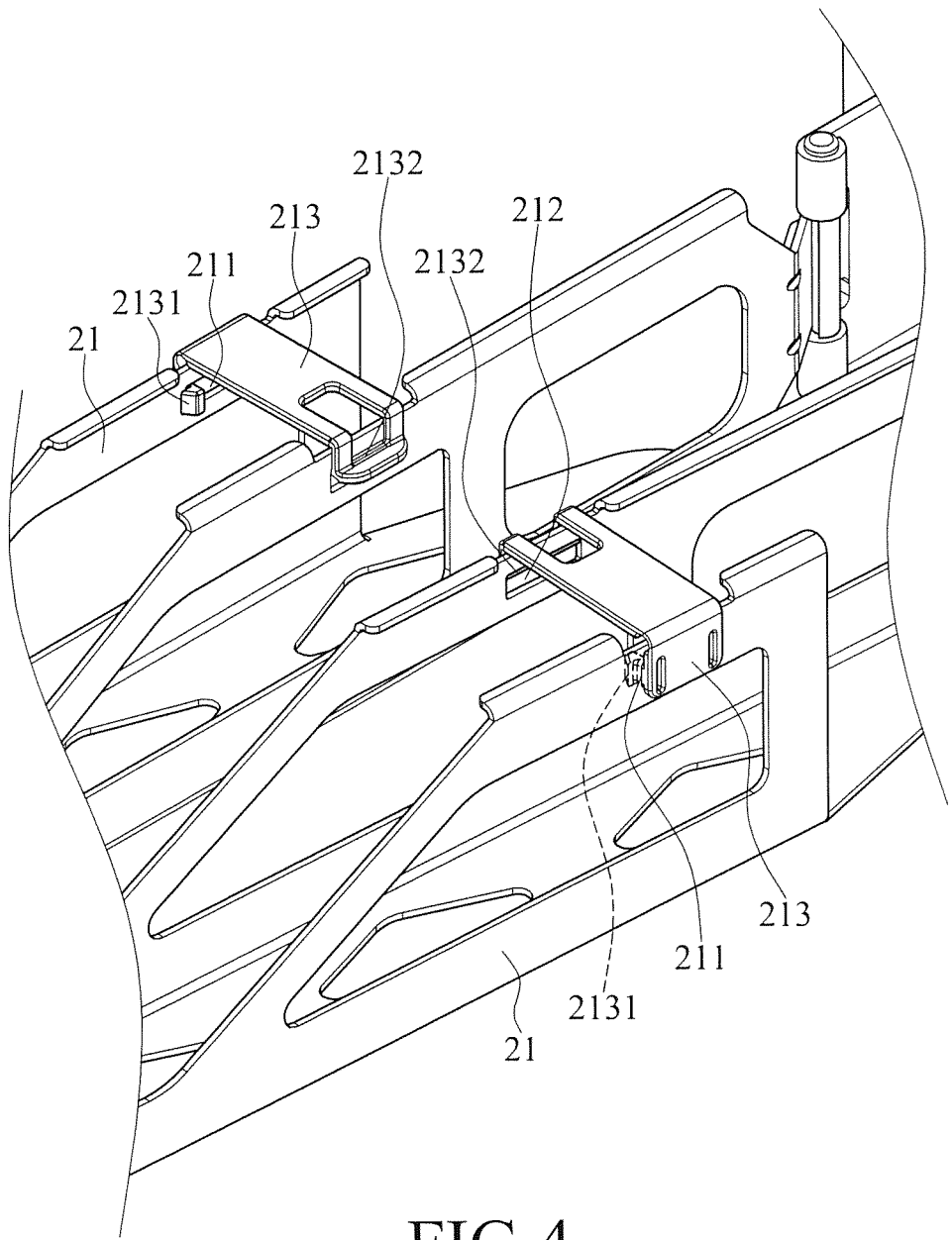
FIG. 4 is a third partial blowup view of a preferred embodiment of the present invention.
Figure 5:
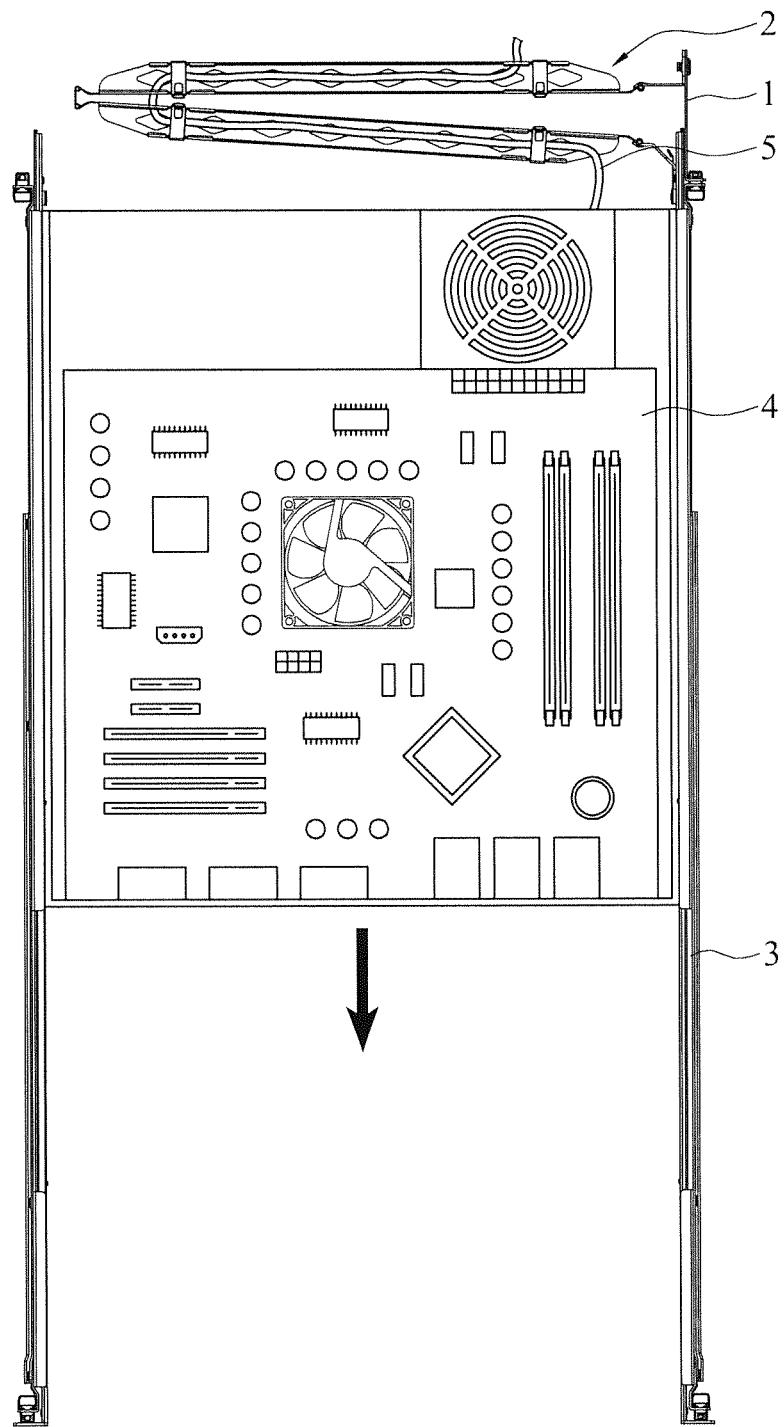
FIG. 5 is a first schematic view of an operating status of a preferred embodiment of the present invention.
Figure 6:
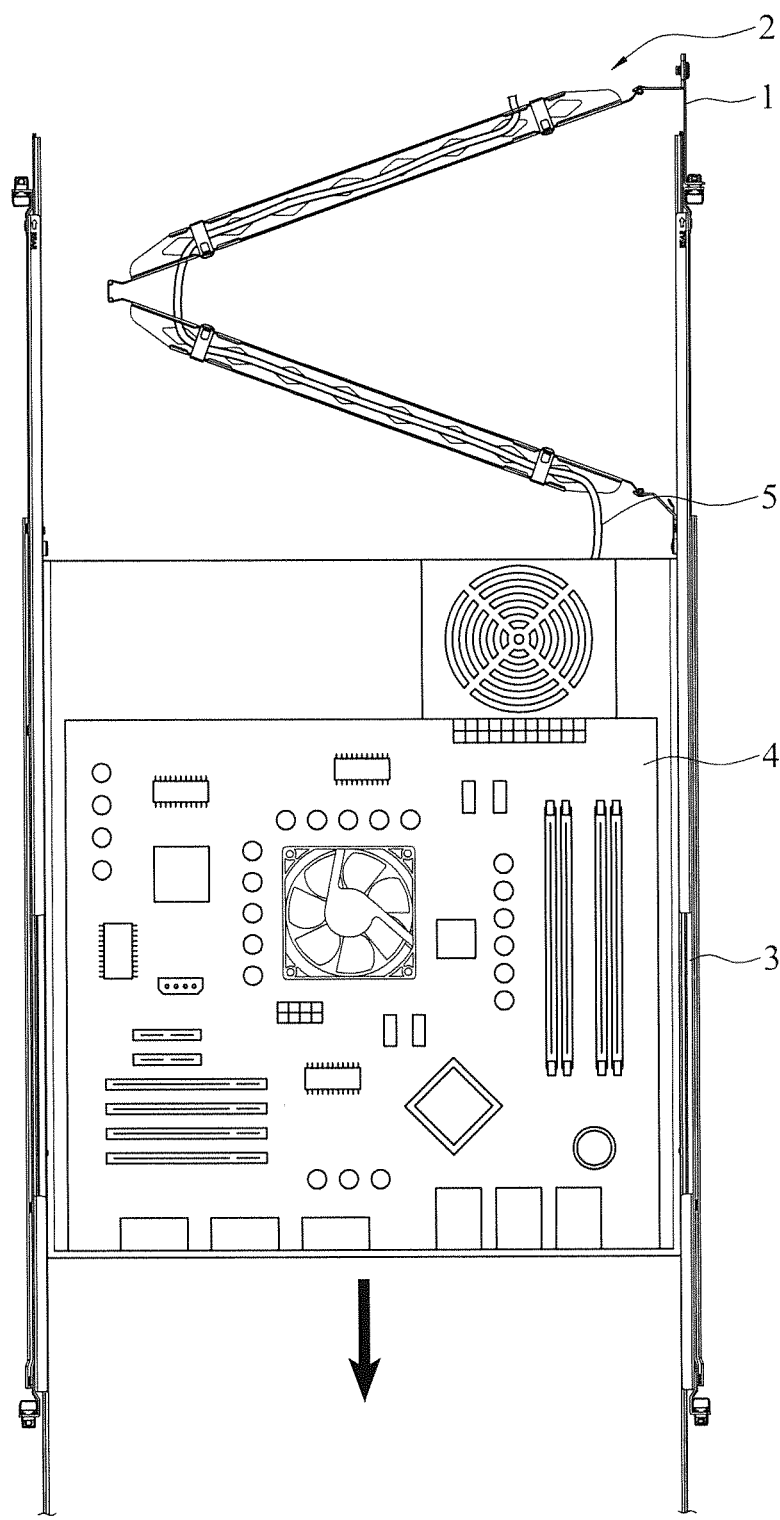
FIG. 6 is a second schematic view of an operating status of a preferred embodiment of the present invention.

The technical content of the present invention will become apparent with the detailed description of preferred embodiments and the illustration of related drawings as follows.

With reference to FIGS. 1, 2-4, 5 and 6 for schematic views, partial blowup views and schematic operating views of a cable management arm 2 of a server rack 1 in accordance with a preferred embodiment of the present invention respectively, the server rack 1 is installed between a rear end of a slide 3 and the server rack 1 and provided for accommodating at least one connecting wire 5 used by a server 4, and the cable management arm 2 may change its length as the slide 3 is pulled and stretched. The cable management arm 2 comprises a pair of cable frames 21, a pair of first connecting bases 22 and a pair of first connecting members 23.

Wherein, the two cable frames 21 are long-strip structure having a trough-shaped cross-section for accommodating the connecting wire 5 therein, and each cable frame 21 has an open top, and a pair of installing holes 211 and a pair of latching holes 212 are symmetrically formed at the top of two sidewalls of each cable frame 21 and provided for installing a latch element 213 therebetween, so that the connecting wire 5 is covered therein, and an installing portion 2131 is disposed at an end of the latch element 213 and configured to be corresponsive to the installing hole 211, and a hook 2132 is installed at the other end of the latch element 213 and configured to be corresponsive to the latching hole 212. It is noteworthy that a connecting plate 214 is coupled between the two cable frames 21, and two side edges of the connecting plate 214 are respectively and pivotally coupled between the head and the tail of the two cable frames 21, so that the two cable frames 21 can be unfolded or stacked and folded.

The pair of first connecting bases 22 are installed at the rear of the slide 3 (in other words, the movable end which refers to an inner slide not shown in the figure) and the server rack 1, and the center of each first connecting base 22 is formed by a punching method, and a first notch 221 and a first snap hole 222 are formed at the center, so that the first snap hole 222 is formed at the center of the first notch 221.

The pair of first connecting members 23 are installed in the first connecting bases 22 respectively, and each first connecting member 23 comprises: a first movable plate 231 with a side pivotally coupled to an open end of one of the cable frames 21 and having a first through hole 2311 formed at the center of the first movable plate 231; and a first elastic plate 232 with an end fixed to a side of the first through hole 2311 and having a first snap portion 2321 configured to be corresponsive to the first through hole 2311, and the first snap portion 2321 having a section bent downwardly from a sidewall and a bevel 2322 formed in a direction corresponsive to the direction of inserting the first connecting base 22. In addition, the first snap portion 2321 has a length greater than the total thickness of the first elastic plate 232 and the first connecting base 22, such that when the first connecting member 23 is installed in the first notch 221, the first snap portion 2321 is passed and snapped into the first snap hole 222, and the cable frame 21 is coupled between a rear end of the slide 3 and the server rack 1 and the two cable frames 21 can be unfolded and displaced as the slide 3 is stretched.

Figure 7:
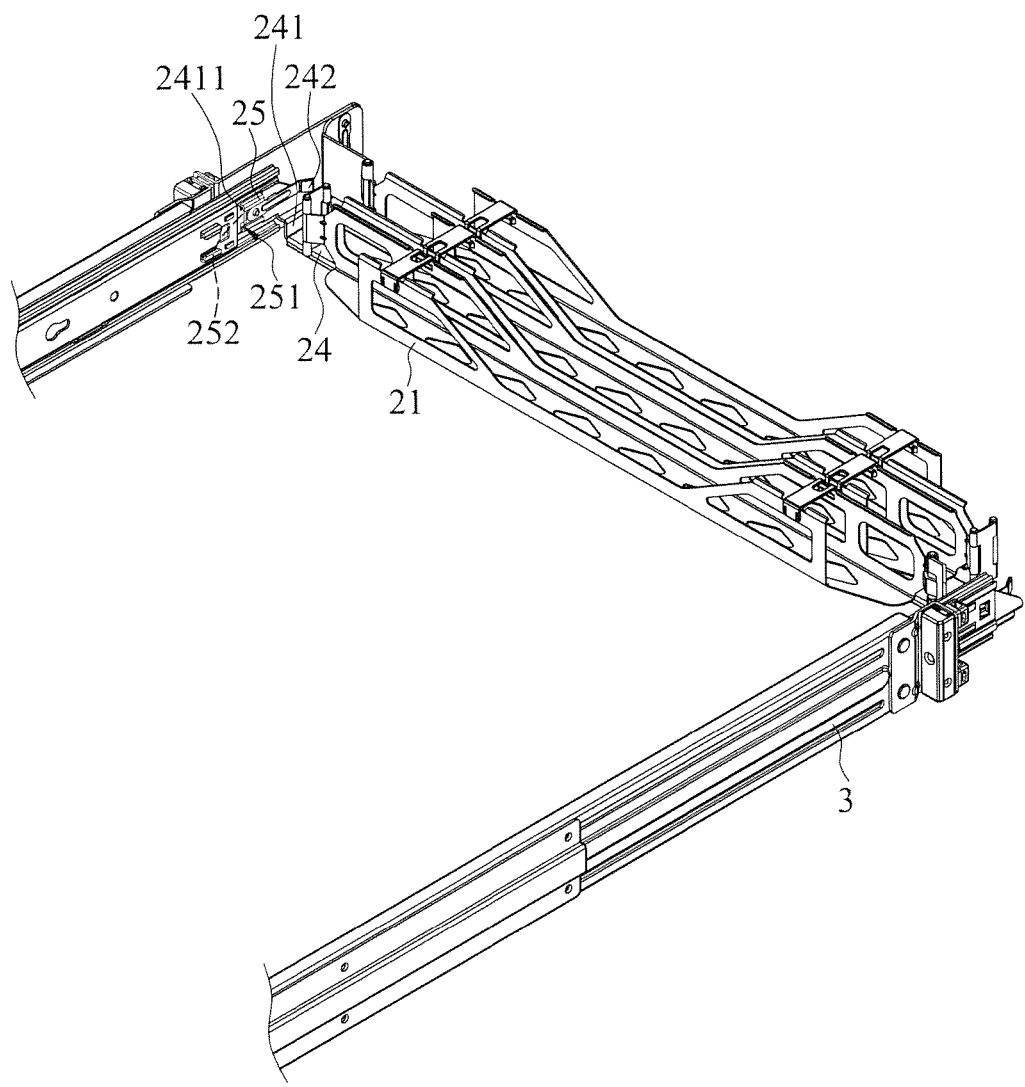
FIG. 7 is a schematic view of another preferred embodiment of the present invention.
Figure 8:
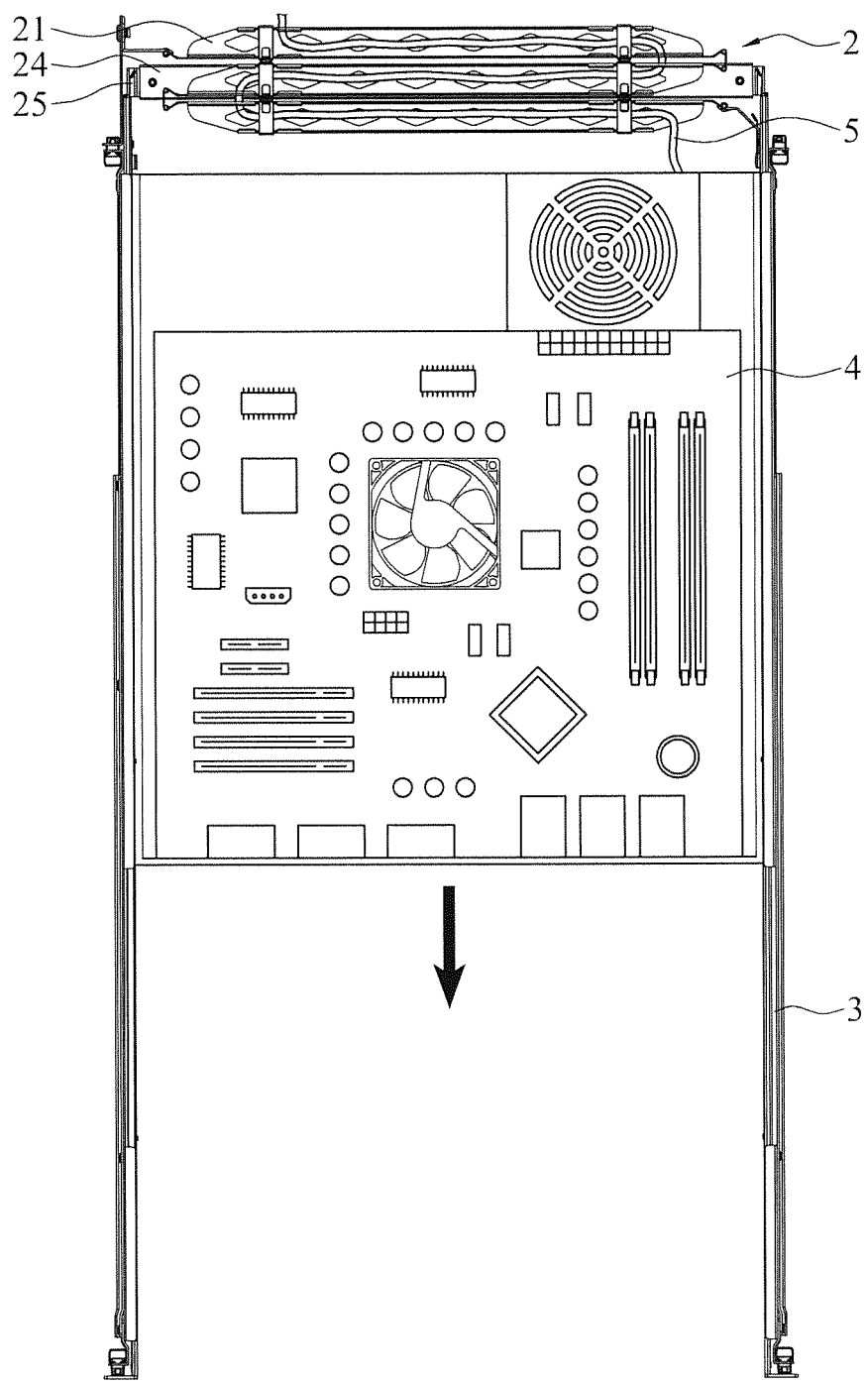
FIG. 8 is a first schematic view of an operating status of another preferred embodiment of the present invention.
Figure 9:
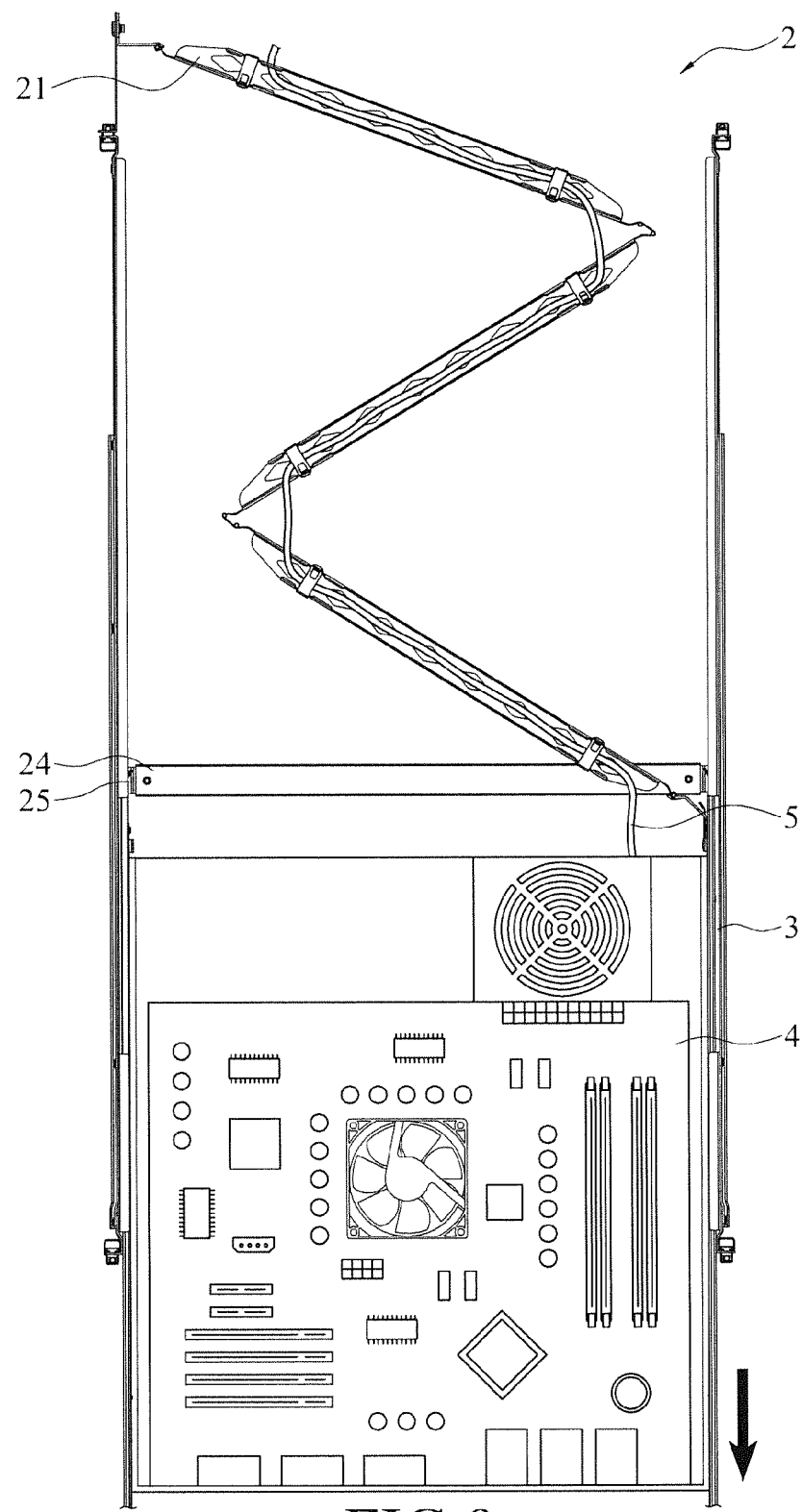
FIG. 9 is a second schematic view of an operating status of another preferred embodiment of the present invention.

With reference to FIGS. 7, 8 and 9 for a schematic view of the structure and schematic views of different operating statuses in accordance with another preferred embodiment of the present invention respectively, the cable management arm 2 of the present invention adopts a three-section design with three groups of cable frames 21 to cope with the slide 3 designed with a large stroke, but the connection of the three groups of cable frames 21 with insufficient support gives rise to a problem of drooping the cable frames 21. Therefore, the present invention further comprises a support frame 24 and a pair of second connecting bases 25, and the pair of second connecting bases 25 are disposed on the two slides 3 respectively, and each second connecting base 25 has a second notch 251 and a second snap hole 252 formed at the center of the second connecting base 25, so that the second snap hole 252 is disposed at the center of the second notch 251. The installed support frame 24 is disposed across and coupled between the two slides 3 and below one of the cable frames 21 and moved synchronously with the slide 3 to provide a support required by the cable frame 21. To facilitate the installation, the aforementioned arrangement of the first movable plate 231 and first elastic plate 232 is adopted, and a second movable plate 241 and a second elastic plate 242 are installed at both ends of the support frame 24 respectively, and the two second movable plates 241 are respectively and pivotally coupled to both ends of the support frame 24, and a second through hole 2411 is formed at the center of the second movable plate 241; and ends of the two first elastic plates 242 are fixed to a side of the second through hole 2411, and the two second elastic plates 242 have a second snap portion 2421 corresponsive to the second through hole 2411, wherein the second snap portion 2421 has a length greater than the total thickness of the second elastic plate 242 and the second connecting base 251. When each second connecting member 2421 is installed into each respective second notch 251, the second snap portion 2421 is passed and snapped into the second snap hole 252 so that the support frame 24 is coupled between the two slides 3 and moved synchronously with the two stretched slides 3. It is noteworthy that the second snap portion 2421 is formed by a punching method, and the second elastic plate 242 has a section bent downwardly from two sidewalls and a bevel 2522 is formed in a direction corresponsive to the direction of inserting the second connecting base 25.

What is claimed is:

1. A cable management arm of a server rack, installed between a rear end of a slide and the server rack, for accommodating at least one connecting wire used by a server, and the cable management arm changing its length as the slide is pulled and stretched and comprising:
   at least two cable frames, each being an elongated structure with a trough-shaped cross-section for accommodating the connecting wire therein, and the two cable frames being pivotally coupled as a whole by a head-to-tail connection method;
   a pair of first connecting bases, installed to a movable end of the slide and the server rack, and each first connecting base having a first notch and a first snap hole formed at the center of the first connecting base, so that the first snap hole is disposed at the center of the first notch; and
   a pair of first connecting members, installed in the first connecting base respectively, and each first connecting member comprising:
   a first movable plate, with a side pivotally coupled to an open end of one of the cable frames, and having a first through hole formed at the center of the first movable plate; and
   a first elastic plate, with an end fixed to a side of the first through hole, and having at least one first snap portion corresponsive to the first through hole, and the first snap portion having a length greater than a total thickness of the first elastic plate and the first connecting base, such that when the first connecting member is installed into the first notch, the first snap portion is passed and snapped into the first snap hole, and the cable frame is coupled between a rear end of the slide and the server rack, and the cable frame is unfolded and displaced with the stretched slide.

2. The cable management arm of a server rack as claimed in claim 1, wherein the first snap portion has a section bent downwardly from a sidewall and a bevel formed in a direction corresponsive to the direction of inserting the first connecting base.

3. The cable management arm of a server rack as claimed in claim 1, wherein the cable frame has an open top surface and includes at least one installing hole and at least one latching hole symmetrically formed at the top of the two sidewalls respectively and provided for installing a latch element therebetween, such that the connecting wire is covered therein.

4. The cable management arm of a server rack as claimed in claim 3, wherein the latch element includes an installing portion disposed at an end of the latch element and configured to be corresponsive to the installing hole, and a hook installed at the other end of the latch element and configured corresponsive to the latching hole.

5. The cable management arm of a server rack as claimed in claim 1, further comprising a connecting plate with both sides pivotally coupled between the two cable frames.

6. The cable management arm of a server rack as claimed in claim 1, further comprising a support frame and a pair of second connecting bases, and the second connecting bases are disposed on the two slides respectively, and each second connecting base having a second notch and a second snap hole formed at the center of the second connecting base, such that the second snap hole is disposed at the center of the second notch, such that the assembled support frame is disposed the middle across the two slides and below the cable frame and movable synchronously with the slide, for providing a support required by the cable frame.

7. The cable management arm of a server rack as claimed in claim 6, further comprising a pair of second movable plates and a pair of second elastic plates, and the two second movable plates being respectively and pivotally coupled to both ends of the support frame, and the second movable plate having a second through hole formed at the center of the second movable plate, and an end of the two first elastic plates being fixed to a side of the second through hole, and the two second elastic plates having at least one second snap portion configured to be corresponsive to the second through hole, and the second snap portion having a length greater than a total thickness of the second elastic plate and the second connecting base, such that when each second connecting member installed into each second notch, the second snap portion is passed and latched into the second snap hole to connect the support frame between the two slides and move synchronously as the two slides are stretched.

8. The cable management arm of a server rack as claimed in claim 7, wherein the second snap portion has a section bent downwardly from a sidewall and a bevel formed in a direction corresponsive to the direction of inserting the second connecting base.

* * * * *